United States Patent
Gupta et al.

(10) Patent No.: US 9,647,699 B1
(45) Date of Patent: May 9, 2017

(54) DUAL SUPPLY VOLTAGE POWER HARVESTING IN AN OPEN DRAIN TRANSMITTER CIRCUIT

(71) Applicant: STMicroelectronics International N.V., Amsterdam (NL)

(72) Inventors: Nitin Gupta, Noida (IN); Tapas Nandy, Delhi (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 14/984,040

(22) Filed: Dec. 30, 2015

(51) Int. Cl.
| | |
|---|---|
| H04K 1/02 | (2006.01) |
| H04L 25/03 | (2006.01) |
| H04L 25/49 | (2006.01) |
| H04B 1/04 | (2006.01) |

(52) U.S. Cl.
CPC ....... *H04B 1/04* (2013.01); *H04B 2001/0408* (2013.01)

(58) Field of Classification Search
None
See application file for complete search history.

(56) References Cited

U.S. PATENT DOCUMENTS

| | | | |
|---|---|---|---|
| 7,027,792 B1* | 4/2006 | Luff | H03D 7/1425 327/113 |
| 8,786,321 B2 | 7/2014 | Gupta et al. | |
| 2007/0001751 A1* | 1/2007 | Sundararaman | G05F 3/30 327/541 |
| 2010/0238848 A1* | 9/2010 | Ziazadeh | H03M 1/0881 370/282 |
| 2012/0212259 A1* | 8/2012 | Riva | G01R 19/10 327/89 |
| 2014/0269130 A1* | 9/2014 | Maeng | G11C 7/1084 365/207 |

* cited by examiner

*Primary Examiner* — Shuwang Liu
*Assistant Examiner* — Gina McKie
(74) *Attorney, Agent, or Firm* — Gardere Wynne Sewell LLP

(57) ABSTRACT

A power harvesting circuit for use in an open drain transmitter circuit is configured to generate two distinct harvested supply voltages at different voltage levels along with two distinct cascode voltages at different voltage levels. The harvested supply voltages are used to power circuitry in the transmitter circuit. The cascode voltages are used to bias cascode transistors in the open drain circuitry for different channels.

23 Claims, 7 Drawing Sheets

DUAL SUPPLY VOLTAGE POWER HARVESTING IN AN OPEN DRAIN TRANSMITTER CIRCUIT

TECHNICAL FIELD

The present invention relates to method and apparatus for power harvesting in open drain transmitter circuits.

BACKGROUND

In open drain transmitters, such as those used in high definition multi-media interface (HDMI) operation, a receiver provides a common mode bias voltage across receiver terminating resistors to an open drain of a transmitter. FIG. 1 shows an example of a typical system 100 with an open drain transmitter/receiver configuration. A transmitter 110 comprises a differential pair of open drain transistors 111 which transmit differential data (D) over lines TX− and TX+ to a receiver 120 over the channel 130 having an impedance Z0. The transistors 111 draw current from a voltage source (AVcc) 121 of the receiver 120 and a voltage drop across terminating resistors ($R_T$) 123 and 122 at the receiver is used to determine the transmitted data. A current source 112 in the transmitter 110 is used to determine the current drawn from the receiver (this current may have a set limit in accordance with a transmitter protocol). Typically, the current is fed back to the receiver via a ground path 113 coupled between the transmitter 110 and receiver 120.

Reference is now made to FIG. 2. It is known in the art to harvest this current to provide power to the transmitter. Using power harvested from the current would negate the need for providing an additional power source for the transmitter. In other words, an independent power supply need not be provided in the transmitter itself. However, because a pre-amplifier circuit is conventionally used to switch the data signal passed by the transmitter, the harvested current requires a voltage boost in order to maintain a suitable voltage difference for operation of the preamplifier circuit. Level shifters within the pre-amplifier introduce speed limits on the transmitter output. Power efficiency with such power harvesting circuitry is also a concern.

FIG. 2 shows an open drain differential pair of transistors NL0 and NL1 (for example, n-channel MOSFETs). The gate terminals of transistors NL0 and NL1 receive differential data output from a pre-amplifier circuit 220 and the drain terminals of the transistors NL0 and NL1 are connected to pads TX− and TX+(coupled through channel 130 to the receiver 120 as shown in FIG. 1). Data is input to the pre-amplifier circuit 220 from a serializer circuit 210. A drive current Idr through the differential transistors NL0 and NL1 is determined by a current sensor/control block 241 that receives a bias signal. The current sensor/control block 241 forms part of a voltage recovery (power harvesting) circuit 240 which recovers the power in the drive current through use of a voltage regulator 243 to provide a supply voltage Vdd to the serializer 210, preamplifier 220 and perhaps other circuitry.

In order to effectively switch the transistors NL0 and NL1, the pre-amplifier 220 may require a supply voltage Vdd that is higher than a voltage regulated solely from the drive current. In such a case, a voltage booster 242 is accordingly provided in circuit 240 to boost the voltage prior to regulation and the output of voltage Vdd to the pre-amplifier 220. For example, the drive current alone may be sufficient to generate logic level power supply voltage. However, other circuitry, such as phase-lock-loop (PLL) circuitry, may need a power supply voltage that is higher than logic level. Operation of the transmitter in a fully power harvested implementation is not typically possible due to the need for multiple different power supply voltages. If the multiple voltages are provided by a booster circuit, such as through the use of booster 242, there is a loss of power efficiency.

There is accordingly a need in the art for multiple supply voltage power harvesting in open drain transmitter circuits. Such a power harvesting solution would desirably provide at least two different power supply levels including a logic level power supply and a higher power supply. Furthermore, such a solution would not require the use of a voltage booster circuit.

SUMMARY

In an embodiment, a power harvesting circuit for an open drain transmitter having a first open drain transmit pad and a second open drain transmit pad comprises: a reference current generator circuit configured to generate a reference bias current; and a first cascode voltage generator circuit biased by a first bias current derived from said reference bias current. The first cascode voltage generator comprises: a first resistive divider coupled between the first and second open drain transmit pads; a first pair of cascode transistors coupled to the first and second open drain transmit pads and having control terminals coupled to a first common node of the first resistive divider; a first differential pair of transistors coupled in series with the first pair of cascode transistors and connected at a second common node; and a regulator circuit having an input coupled to the second common node and an output at the first common node.

In an embodiment, a power harvesting circuit for an open drain transmitter having a first open drain transmit pad and a second open drain transmit pad comprises: a first harvested power regulator circuit coupled to the first and second open drain transmit pads and configured to generate a first power supply voltage at a first harvested power supply node; and a second harvested power regulator circuit coupled to the first and second open drain transmit pads and configured to generate a second power supply voltage, different from the first supply voltage, at a second harvested power supply node; a first cascode voltage generator circuit biased by a first bias current and including a regulator circuit configured to generate a first cascode voltage referenced to the first power supply voltage; and a second cascode voltage generator circuit biased by a second bias current and including a regulator circuit configured to generate a second cascode voltage referenced to the second power supply voltage.

In an embodiment,

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 3:
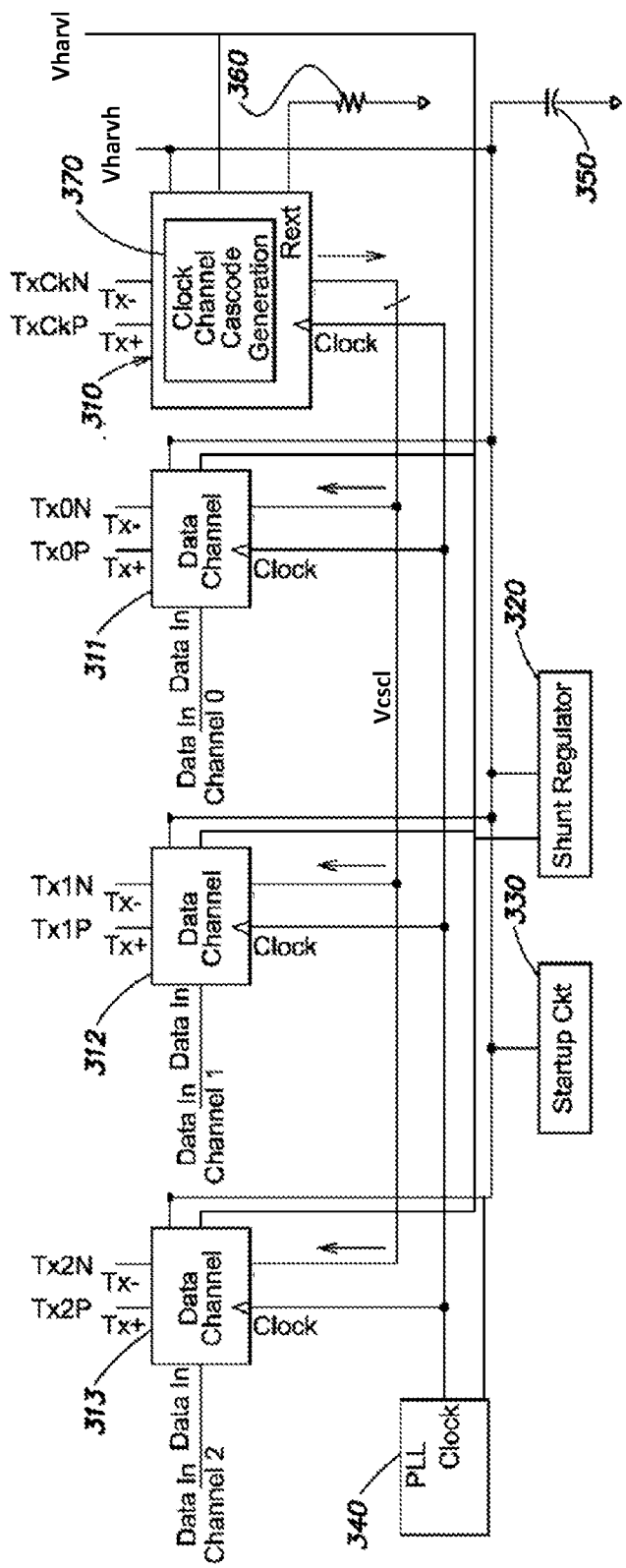
FIG. 3 illustrates an example of a four channel open drain transmitter.

FIG. 3 shows an example of a four channel open drain transmitter according to an embodiment. It will be appreciated that the HDMI specification requires four channels however the number of channels is not restrictive on the working embodiments.

The transmitter of FIG. 3 comprises a clock channel 310, a first data channel 311, a second data channel 312 and a third data channel 313. Each data channel 311, 312, 313 receives a data input and provides two differential open drain transmission outputs Tx0P and Tx0N, Tx1P and Tx1N, and Tx2P and Tx2N connected to the receiver, respectively. Each of the four channels 310, 311, 312 and 313 is connected to receive a clock signal CLK output from a phase lock loop (PLL) 340 and is further connected to a first voltage line Vharvh providing a power supply voltage Vharvh and connected to a second voltage line Vharvl providing a power supply voltage Vharvl. The data channels 311, 312, 313 include logic circuits a pre-driver circuit that are powered from the power supply voltage Vharvl. Some circuit portions of the phase lock loop (PLL) circuitry 340 are powered from the power supply voltage Vharvh. The voltage lines Vharvh and Vharvl are connected to a shunt regulator 320, a start-up circuit 330 and external capacitor 350 to provide the source voltages Vharvl and Vharvh to logic/driver/amplifier circuitry within the channels 310, 311, 312 and 313 of the transmitter. In an embodiment, the second voltage line Vharvl may include a capacitor (similar to capacitor 350) depending on noise level and pole/zero position.

Two harvested supply voltages Vharvl and Vharvh are used because some circuit components are biased from a higher supply voltage (such as PLL circuitry, charge pump circuitry, current to voltage conversion circuitry, etc.) while other circuit components are biased from a lower supply voltage (such as any circuits using thin oxide MOSFET devices). In an embodiment, voltage Vharvl is approximately 0.9-1.0 V, while voltage Vharvh is approximately 1.8 V.

The clock channel 310 is connected to a clock input from the PLL 340 and has two differential open drain clock outputs TxCKP and TxCKN. The clock channel is further connected to an external resistor 360. The clock channel 310 comprises a clock channel cascode generation circuit 370 which generates a first cascode drive voltage Vcscl and a second cascode drive voltage Vcsch. The first cascode drive voltage Vcscl provides a biasing signal to the open drain circuits of data channels 311, 312 and 313 which may determine a drive current of the data channel. The second cascode drive voltage Vcsch provides a biasing signal to the open drain circuit used within the clock channel 310 to determine a drive current of the clock channel.

The shunt regulator 320 and the external capacitor 350 form a voltage regulator to harvest power from a receiver using current drawn from the receiver source. The voltage regulator may only provide power when the transmitter is on, therefore the start-up circuit 330 is used to provide Vharvh when the transmitter is in a power down mode or at a start-up of the transmitter.

Figure 4:
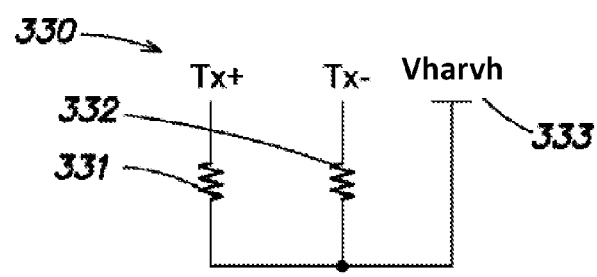
FIG. 4 is a circuit diagram of a start-up circuit.

FIG. 4 is a circuit diagram of the start-up circuit 330. The start-up circuit 330 comprises two connectors Tx+ and Tx− which may be connected to the receiver at the start-up or during the power down mode of the transmitter. A start-up circuit may be provided for connection at each of the channels 310, 311, 312, 313. The start-up circuit may be selectively connected to the transmit lines of the respective circuit or may be continuously connected to the transmit lines.

Figure 1:
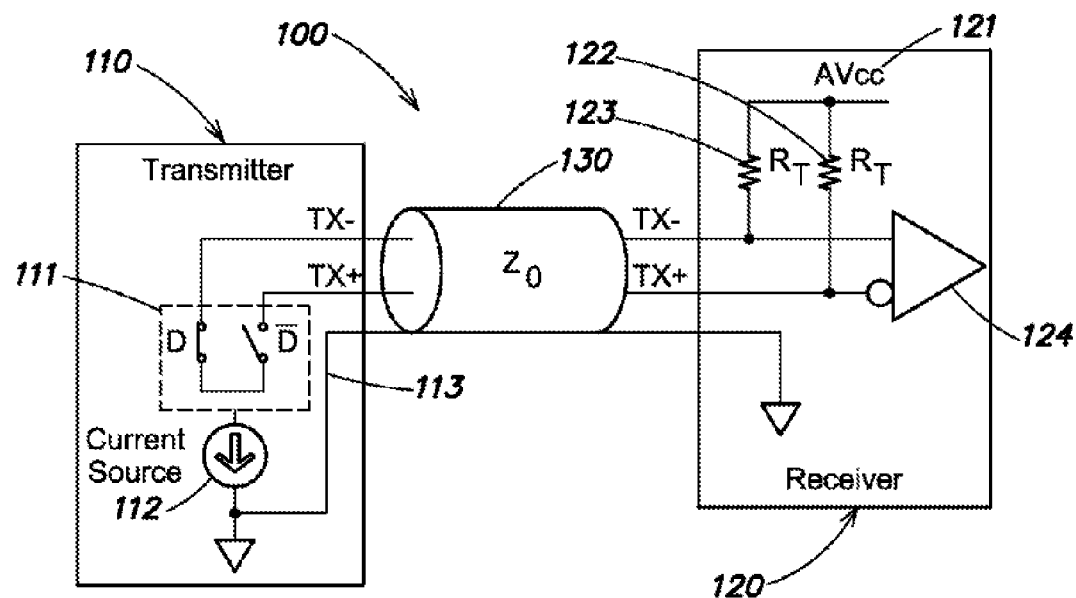
FIG. 1 is a circuit diagram for a typical open drain transmitter/receiver.

The connectors Tx+ and Tx− are connected to a first start-up circuit resistor 331 and a second start-up circuit resistor 332. When the Tx− and Tx+ connectors of the start-up circuit are connected to the receiver, the Tx+ connector connects to a first terminating resistor ($R_T$) of the receiver and the Tx− connector connects to a second terminating resistor ($R_T$) of the receiver, each terminating resistor is connected to a receiver power supply AVcc (see, FIG. 1). The first and second resistors 331 and 332 of the start-up circuit are connected in series at a common node to the Vharvh line to provide the Vharvh voltage on this line when in use.

Figure 5A:
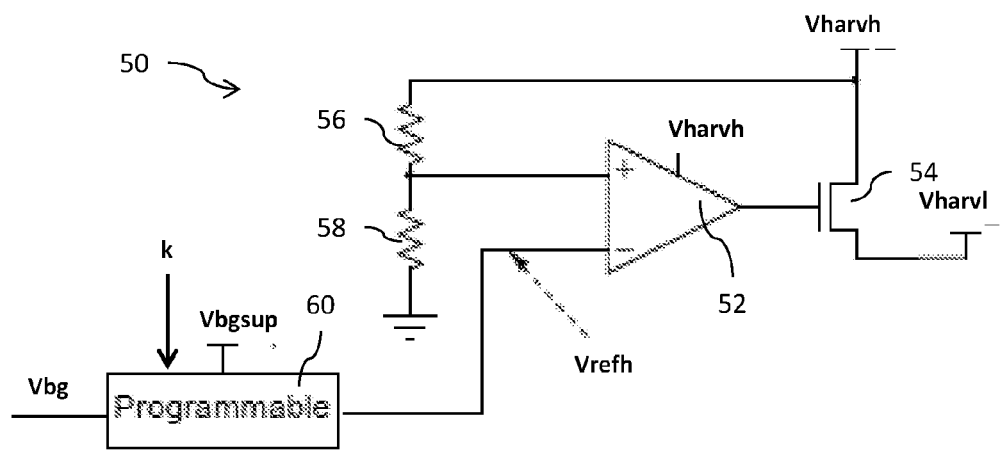
FIGS. 5A and 5B show circuit diagrams for regulator circuits.

Reference is now made to FIG. 5A showing a circuit diagram for a first regulator circuit 50 of the shunt regulator 320. The circuit 50 includes an operational amplifier 52, powered from the Vharvh line, having an inverting input, a non-inverting input and an output. The circuit further includes a transistor 54 (for example, an n-type MOSFET) having a drain terminal coupled to the Vharvh line and a source terminal coupled to the Vharvl line. A gate terminal of the transistor 54 is connected to the output of the amplifier 52. The non-inverting input of the amplifier 52 is also connected to the Vharvh line through a resistor 56. A resistor 58 is connected between the non-inverting input of the amplifier 52 and a ground reference node. The resistors 56 and 58 form a voltage divider. The inverting input of the amplifier 52 receives a first reference voltage Vrefh that is generated by a programmable circuit 60 in response to ratio k of a first bandgap voltage Vbgsup to a second bandgap voltage Vbg. The circuit 50 operates in a manner well known to those in the art to regulate the Vharvh voltage on the Vharvh line by controlling the conduction of transistor 54 so that the voltage at the non-inverting input (i.e., the divided Vharvh voltage) equals the first reference voltage Vrefh at the inverting input. The programmable circuit 60 may, for example, comprise a logic circuit configured to receive the value for the ratio k and generate Vrefh=k(Vbgsup/Vbg).

Figure 5B:
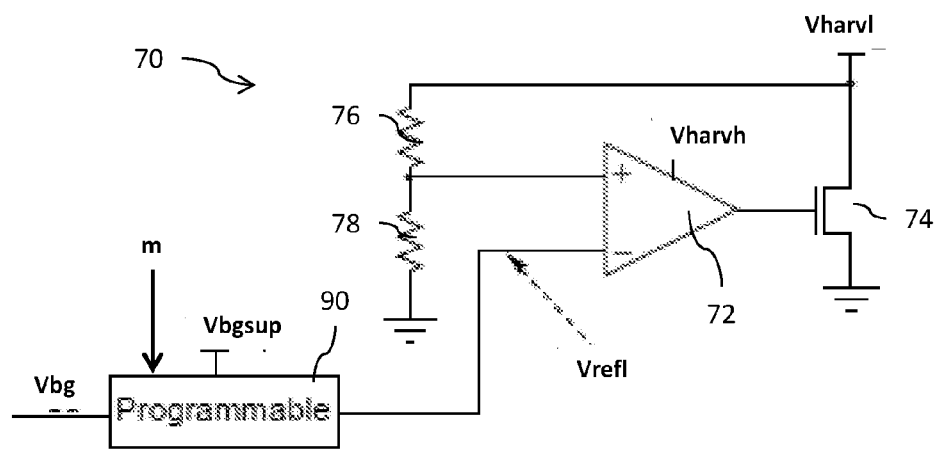

Reference is now made to FIG. 5B showing a circuit diagram for a second regulator circuit 70 of the shunt regulator 320. The circuit 70 includes an operational amplifier 72, powered from the Vharvh line, having an inverting input, a non-inverting input and an output. The circuit further includes a transistor 74 (for example, an n-type MOSFET) having a drain terminal coupled to the Vharvl line and a source terminal coupled to the ground reference node. A gate terminal of the transistor 74 is connected to the output of the amplifier 72. The non-inverting input of the amplifier 72 is also connected to the Vharvh line through a resistor 76. A resistor 78 is connected between the non-inverting input of the amplifier 72 and a ground reference node. The resistors 76 and 78 form a voltage divider. The inverting input of the amplifier 72 receives a second reference voltage Vrefl that is generated by a programmable circuit 90 in response to ratio m of the first bandgap voltage Vbgsup to the second bandgap voltage Vbg. The circuit 70 operates in a manner well known to those in the art to regulate the Vharvlh voltage on the Vharvl line by controlling the conduction of transistor 74 so that the voltage at the non-inverting input (i.e., the divided Vharvl voltage) equals the second reference voltage Vrefl at the inverting input. The programmable circuit 90 may, for example, comprise a logic circuit configured to receive the value for the ratio m and generate Vrefl=m(Vbgsup/Vbg).

Figure 6:
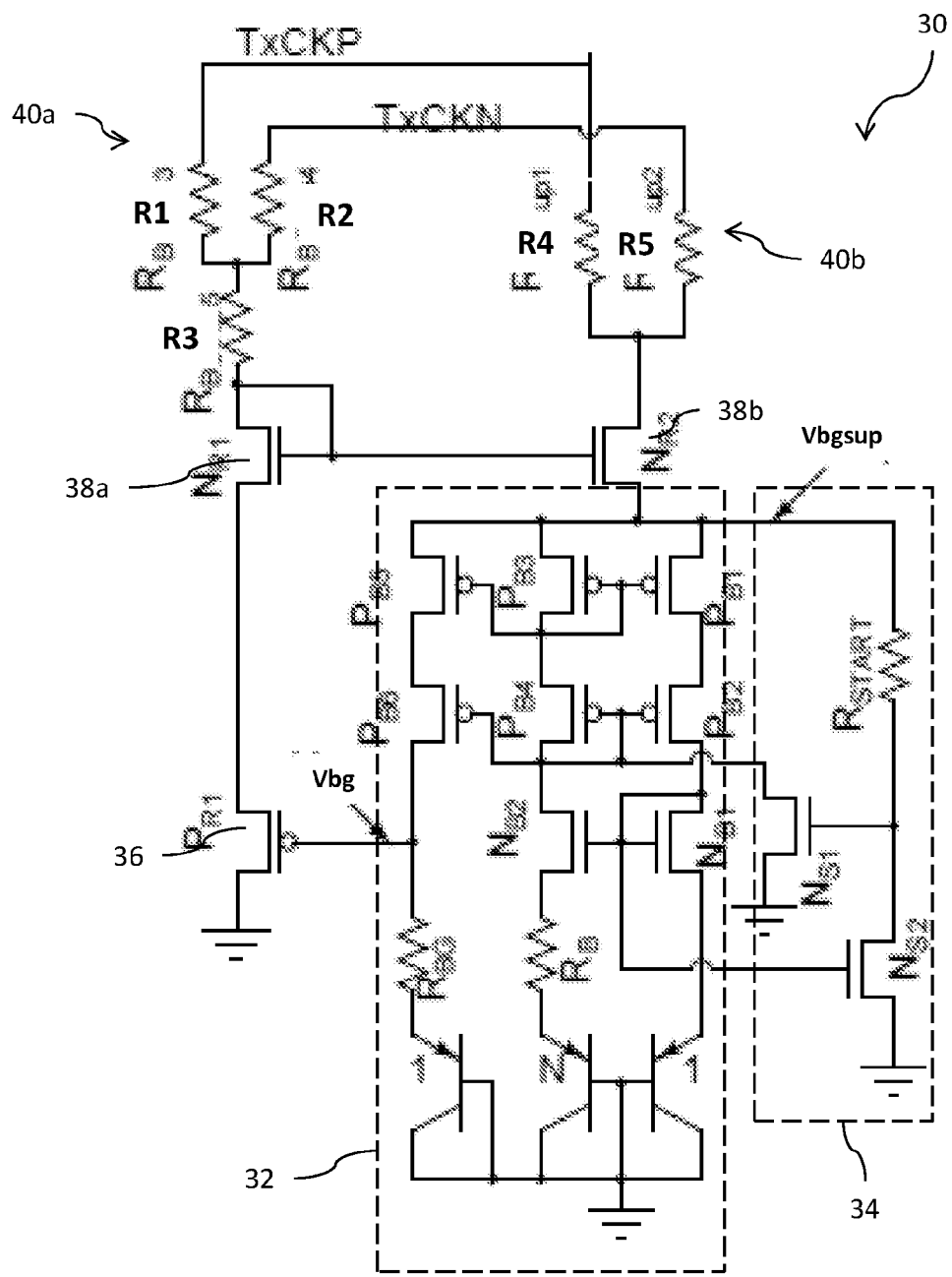
FIG. 6 is a circuit diagram for a bandgap voltage generator circuit.

The first bandgap voltage Vbgsup and the second bandgap voltage Vbg are generated by a bandgap voltage generator circuit 30 as shown in FIG. 6. The circuit 30 includes a conventional bandgap generator 32 having a circuit configuration as well known to those skilled in the art, with a start-up circuit 34, that operates to generate the second bandgap voltage Vbg. The positive power supply for the circuit 30 is the first bandgap voltage Vbgsup. The second bandgap voltage Vbg is applied to the gate terminal of a transistor 36 (for example, a p-channel MOSFET) configured as a current source. A current mirror formed by transistors 38a and 38b is connected at the source of transistor 38a to the source of transistor 36 and further connected at the source of transistor 38b to the positive power supply (first bandgap voltage Vbgsup) for the circuit 30. The current mirror is further connected to the differential clock outputs TxCKP and TxCKN through a first resistor network 40a and a second resistor network 40b. First resistor network 40a includes a resistor R1 connected in series with a resistor R2 between the differential clock outputs TxCKP and TxCKN. A resistor R3 is connected between the drain of transistor 38a and the series connection node of resistors R1 and R2. The second resistor network 40b includes a resistor R4 connected in series with a resistor R5 between the differential clock outputs TxCKP and TxCKN. The series connection node of resistors R4 and R5 is connected to the drain of transistor 38b. The resistors R1-R2 and R4-R5 extract power from the differential clock outputs TxCKP and TxCKN that is used to generate the first bandgap voltage Vbgsup. The feedback loop through transistors 36, 38a and 38b forms a supply stabilizer to the actual bandgap circuit (which is supplied through transistor 38b). This is done because the common mode voltage of the TxP and TxN varies with different speed ranges and source termination values in the transmitters. In an embodiment, the bandgap voltage Vbg is approximately 1.2 V and Vbgsup>Vbg.

Figure 2:
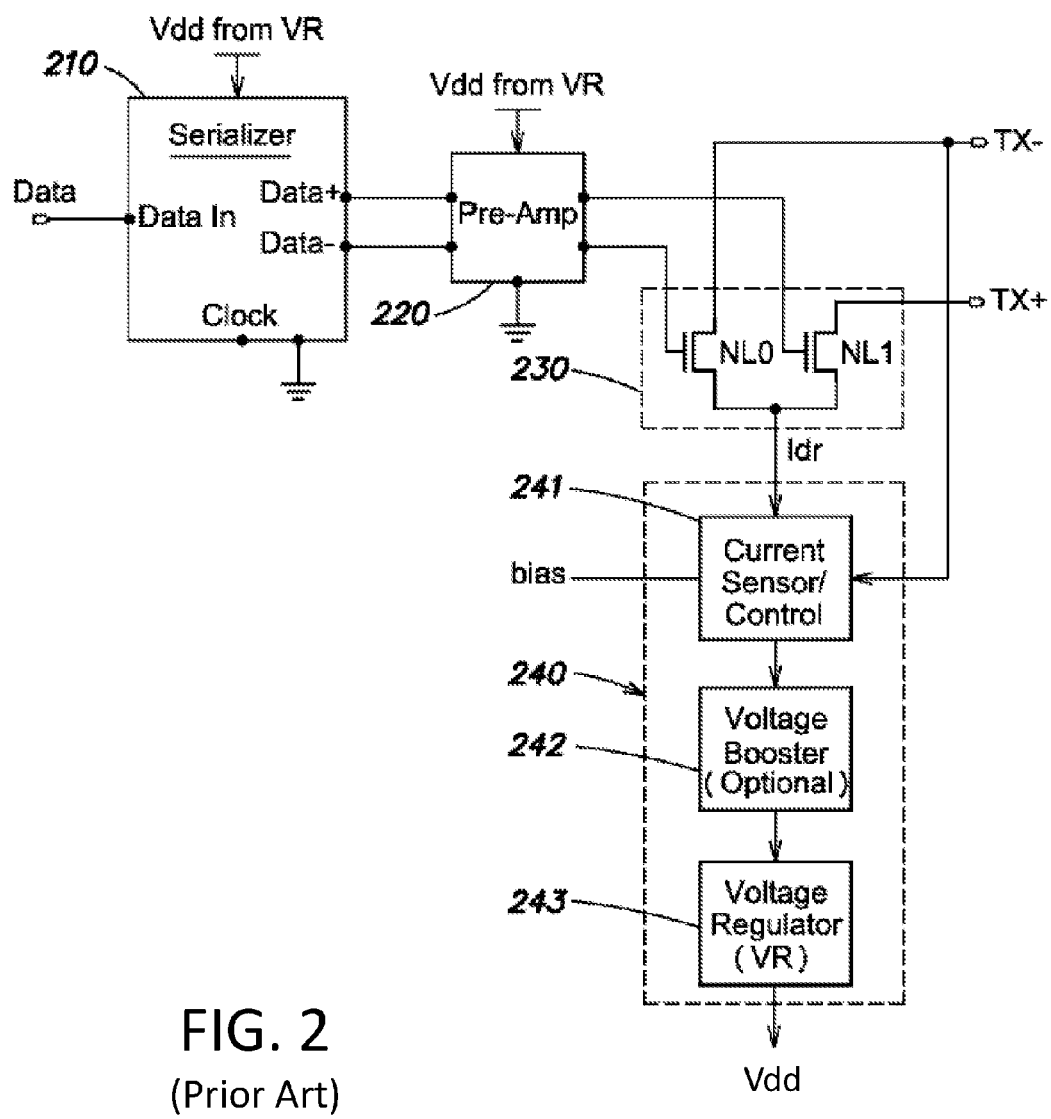
FIG. 2 is a circuit diagram for a power harvesting circuit.
Figure 7A:
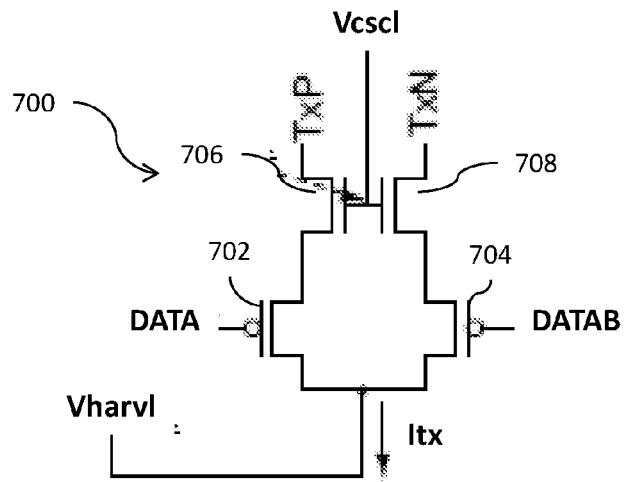
FIGS. 7A and 7B show circuit diagrams for open drain circuits.

Reference is now made to FIG. 7A showing a circuit diagram for the open drain circuit 700 in each of the data channels 311, 312 and 313. A serializer (like that shown at reference 210 in FIG. 2, but not shown here) in each data channel 311, 312 and 313 receives the clock signal CLK from PLL clock 340 and a data input (Data In) and generates a differential data output comprising a data signal (DATA) and a compliment data signal (DATAB). The data signal and compliment data signal are each amplified and conditioned before application to the open drain circuit 700 by appropriate amplifier circuits, with the serializer and amplifier powered from the Vharvh line. The DATA signal is received at the gate terminal of a first p-channel MOSFET 702. The DATAB signal is received at the gate terminal of a second p-channel MOSFET 704. The drain terminal of the first p-channel MOSFET 702 is connected to the drain terminal of the second p-channel MOSFET 704 at the Vharvl voltage line to pass a transmit current Itx. The source terminal of the first p-channel MOSFET 702 is connected to the source terminal of a first n-channel MOSFET 706. The source terminal of the second p-channel MOSFET 704 is connected to the source terminal of a second n-channel MOSFET 708. The gate terminals of transistors 706 and 708 are connected together to receive the first cascode drive voltage Vcscl generated by the clock channel cascode generation circuit 370. The open drain terminal of the first n-channel MOSFET 706 is connected to a first output pad TxP (for example, Tx0P, Tx1P or Tx2P) and the open drain terminal of the second n-channel MOSFET 708 is connected to a second output pad TxN (for example, Tx0N, Tx1N or Tx2N). The Vcscl voltage is used for the cascode bias when the voltage Vharvl is used for the switching signals (DATA and DATAB). The Vcscl and Vharvl voltages determine the current to be drawn out of the transmitter.

The transistors 702 and 704 are activated and deactivated responsive to the data signal (DATA) and compliment data signal (DATAB). The transistors 706 and 708 are biased by the first cascode drive voltage Vcscl, whose voltage value is set by the clock channel cascode generation circuit 370, so as to draw the same transmit current Itx in each of the data channels 311, 312 and 313.

Figure 7B:
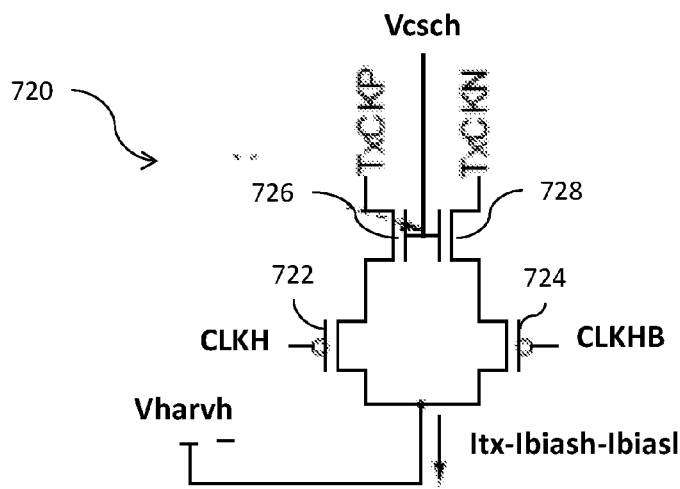

Reference is now made to FIG. 7B showing a circuit diagram for the open drain circuit 720 in the clock channel 310. The clock channel 310 includes a clock circuit (FIG. 9) configured to receive the clock signal CLK from PLL clock 340 and generate a differential clock comprising a clock signal (CLKH) and a compliment clock signal (CLKHB) using a differential clock generator circuit, with the clock circuit powered from the Vharvh line. The CLKH signal is received at the gate terminal of a first p-channel MOSFET 722. The CLKHB signal is received at the gate terminal of a second p-channel MOSFET 724. The drain terminal of the first p-channel MOSFET 722 is connected to the drain terminal of the second p-channel MOSFET 724 at the Vharvh voltage line to pass a transmit current Itx-Ibiash-Ibiasl. The source terminal of the first p-channel MOSFET 722 is connected to the source terminal of a first n-channel MOSFET 726. The source terminal of the second p-channel MOSFET 724 is connected to the source terminal of a second n-channel MOSFET 728. The gate terminals of transistors 726 and 728 are connected together to receive second cascode drive voltage Vcsch generated by the clock channel cascode generation circuit 370. The open drain terminal of the first n-channel MOSFET 726 is connected to a first clock pad TxCKP and the open drain terminal of the second n-channel MOSFET 728 is connected to a second clock pad TxCKN.

The transistors 722 and 724 are activated and deactivated responsive to the clock signal (CLKH) and compliment clock signal (CLKHB). The transistors 726 and 728 are biased by the second cascode drive voltage Vcsch whose voltage value is set by the clock channel cascode generation circuit 370 draw the transmit current Itx-Ibiash-Ibiasl. The reason for this is because a maximum current of Itx may be drawn in each of the channels 310, 311, 312 and 313 (for example, as governed by a standard), but the clock channel 310 further includes the clock channel cascode generation circuit 370 which requires currents Ibiash and Ibiasl for the generation of the first and second cascode drive voltages Vcscl and Vcsch, leaving only the current Itx-Ibiash-Ibiasl for use as charging current in generating the Vharvl and Vharvl voltages using the shunt regulator 320 and the external capacitor 350.

Figure 8:
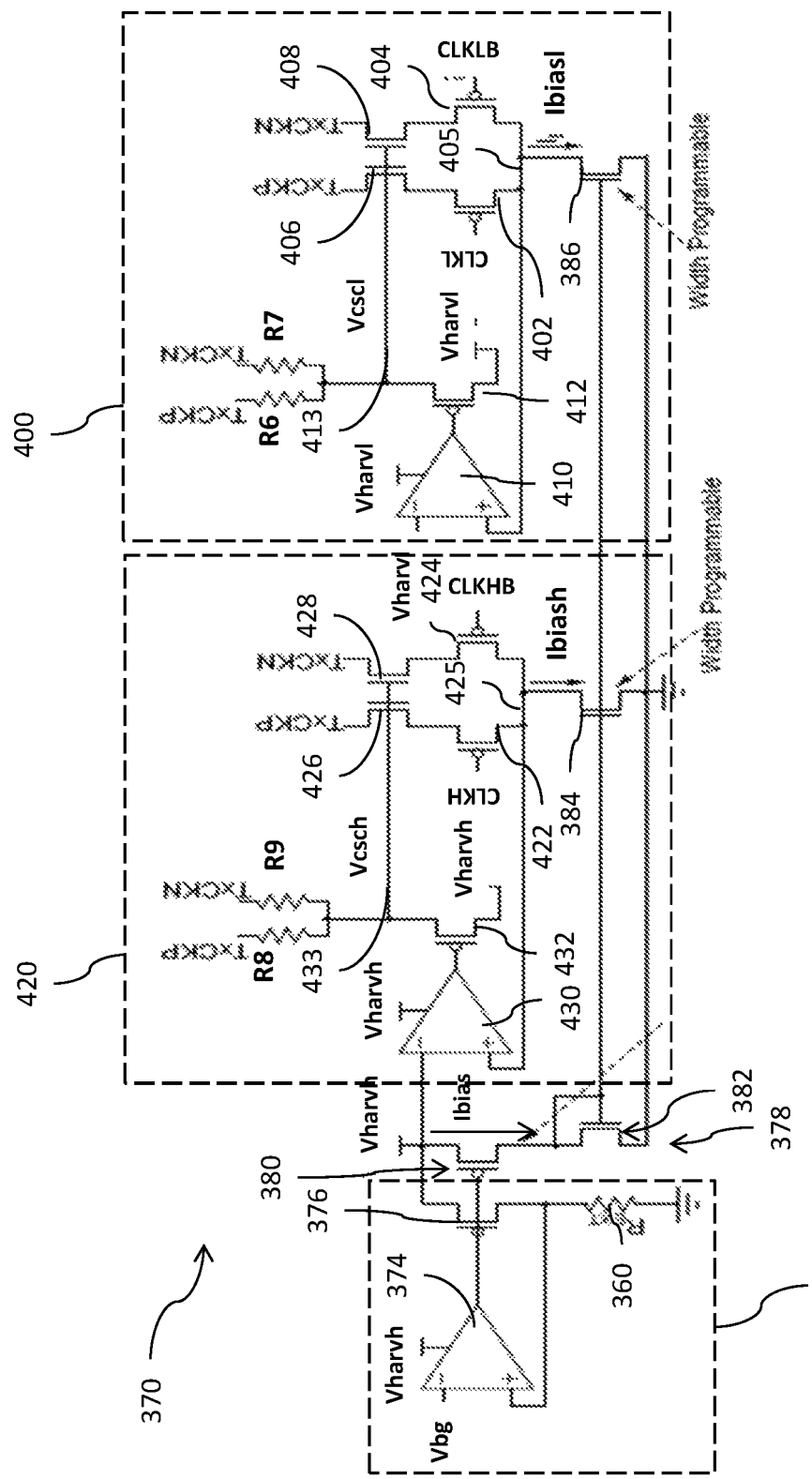
FIG. 8 is a circuit diagram of a clock channel cascode generation circuit.

Reference is now made to FIG. 8 showing a circuit diagram of the clock channel cascode generation circuit 370. The circuit 370 includes a voltage regulator circuit 372 of the low-drop-out type. The circuit 372 includes an operational amplifier 374 having an inverting input, a non-inverting input and an output. The inverting input is connected to receive the second bandgap voltage Vbg and the amplifier 374 is powered from the Vharvlh voltage. The circuit 372 further includes a transistor 376 (for example, a p-channel MOSFET) having a source terminal connected to the Vharvlh voltage, a drain terminal connected to the non-inverting input of the amplifier 372 and a gate terminal connected to the output of the amplifier 372. The resistor 360 (see, also, FIG. 3) is connected between the drain terminal of transistor 376 and the ground reference node. The regulator circuit 370 functions to control conduction of the transistor 376 so that the voltage at the non-inverting input of the amplifier 372 equals the second bandgap voltage Vbg. This sets the current through transistor 376 equal to Vbg/R360 (where R360 is the resistance of resistor 360).

The circuit 370 further includes a bias current generator circuit 378 including a transistor 380 (for example, a p-channel MOSFET) connected in series with a transistor 382 (for example, an n-channel MOSFET). The transistor 380 has a source terminal connected to the Vharvlh voltage, a drain terminal connected to the drain terminal of transistor 376 and a gate terminal connected to the output of the amplifier 372. The transistor 380 accordingly mirrors the current in transistor 376 as the current Ibias. A first tail current transistor 384 is coupled in a current mirror circuit configuration with transistor 382 to generate a high bias current Ibiash. A second tail current transistor 386 is coupled in a current mirror circuit configuration with transistor 382 to generate a low bias current Ibiasl. The relationship between Ibais, Ibiash and Ibiasl is set by the relative size ratios of transistors 382, 384 and 386.

The circuit 370 further includes a voltage generator circuit 400 configured to generate the first cascode drive voltage Vcscl. The clock channel 310 receives a differential clock comprising a clock signal (CLKL) and a compliment clock signal (CLKLB). The CLKL signal is received at the gate terminal of a first p-channel MOSFET 402. The CLKLB signal is received at the gate terminal of a second p-channel MOSFET 404. The drain terminal of the first p-channel MOSFET 402 is connected to the drain terminal of the second p-channel MOSFET 404 at node 405 which receives the bias current Ibiasl from transistor 386. The source terminal of the first p-channel MOSFET 402 is connected to the source terminal of a first n-channel MOSFET 406. The source terminal of the second p-channel MOSFET 404 is connected to the source terminal of a second n-channel MOSFET 408. The gate terminals of transistors 406 and 408 are connected together to receive first cascode drive voltage Vcscl. The open drain terminal of the first n-channel MOSFET 406 is connected to a first clock pad TxCKP and the open drain terminal of the second n-channel MOSFET 408 is connected to a second clock pad TxCKN. An amplifier 410 includes an inverting input, a non-inverting input and an output, and is powered from by Vharvl. A transistor 412 (for example, a p-channel MOSFET) has a source terminal connected to a Vcscl node 413, a drain terminal connected to the Vharvl voltage line and a gate terminal connected to the output of the amplifier 410. The inverting input of the amplifier 410 is connected to the Vharvl voltage line. The non-inverting input of the amplifier 410 is connected to the node 405. A resistor network includes a resistor R6 connected in series with a resistor R7 between the differential clock outputs TxCKP and TxCKN. The series connection node of resistors R6 and R7 is connected to the Vcscl node 413 from which the first cascode drive voltage Vcscl is generated.

The circuit 370 further includes a voltage generator circuit 420 configured to generate the second cascode drive voltage Vcsch. The clock channel 310 receives a differential clock comprising a clock signal (CLKH) and a compliment clock signal (CLKHB). The CLKH signal is received at the gate terminal of a first p-channel MOSFET 422. The CLKHB signal is received at the gate terminal of a second p-channel MOSFET 424. The drain terminal of the first p-channel MOSFET 422 is connected to the drain terminal of the second p-channel MOSFET 424 at node 425 which receives the bias current Ibiash from transistor 384. The source terminal of the first p-channel MOSFET 422 is connected to the source terminal of a first n-channel MOSFET 426. The source terminal of the second p-channel MOSFET 424 is connected to the source terminal of a second n-channel MOSFET 428. The gate terminals of transistors 426 and 428 are connected together to receive second cascode drive voltage Vcschl. The open drain terminal of the first n-channel MOSFET 426 is connected to a first clock pad TxCKP and the open drain terminal of the second n-channel MOSFET 428 is connected to a second clock pad TxCKN. An amplifier 430 includes an inverting input, a non-inverting input and an output and is powered from Vharvh. A transistor 432 (for example, a p-channel MOSFET) has a source terminal connected to a Vcsch node 433, a drain terminal connected to the Vharvh voltage line and a gate terminal connected to the output of the amplifier 430. The inverting input of the amplifier 430 is connected to the Vharvh voltage line. The non-inverting input of the amplifier 430 is connected to the node 425. A resistor network includes a resistor R8 connected in series with a resistor R9 between the differential clock outputs TxCKP and TxCKN. The series connection node of resistors R8 and R9 is connected to the Vcsch node 433 from which the second cascode drive voltage Vcsch is generated.

Figure 9:
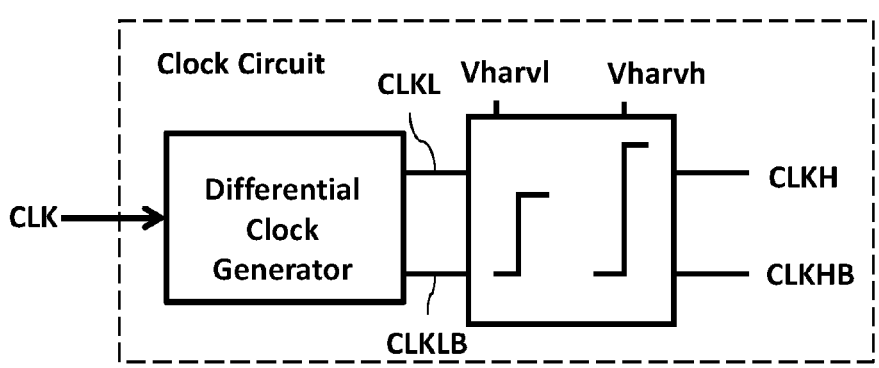
FIG. 9 is a block diagram for a clock circuit including a clock level shifter.

The clock signal (CLKH) and compliment clock signal (CLKHB) are referenced to the Vharvh voltage and the clock signal (CLKL) and compliment clock signal (CLKLB) are referenced to the Vharvl voltage, where Vharvh>Vharvl. The clock circuit as shown in FIG. 9 within the clock channel 310 receives the clock signal from PLL clock 340 and generates a differential clock comprising the clock signal (CLKL) and compliment clock signal (CLKLB) using a differential clock generator circuit. The clock circuit further includes a level shifting circuit that is configured to shift the voltage level of the clock signal (CLKL) and compliment clock signal (CLKLB) to generate a differential clock comprising the clock signal (CLKH) and compliment clock signal (CLKHB).

The transistors 384 and 386 are implemented with programmable widths in order to set a first size ratio between transistors 384 and 382 (to control the magnitude of the high bias current Ibiash) and set a second size ratio between transistors 386 and 382 (to control the magnitude of the low bias current Ibiasl). The difference in magnitudes of the bias currents Ibaisl and Ibiash is exploited in the circuits 400 and 420 to set different magnitudes for the first and second cascode drive voltages Vcscl and Vcsch, respectively. These voltages Vcscl and Vcsch are generated, however, using a single resistor 360 through operation of the bias current generator circuit 378 and regulator 372.

The clock channel cascode generation circuit 370 functions to generate the first and second cascode drive voltages Vcscl and Vcsch responsive to the clock signals.

With respect to the first cascode drive voltage Vcscl, the transistor 386 carries the bias current Ibiasl and the on resistance of the transistor 386 will produce a value of a control voltage at node 405. Responsive to the clock signal (CLKL) and compliment clock signal (CLKLB), the bias current Ibaisl flows through an activated one of the transistors 402 and 404 along with its connected cascode transistor 406 and 408. The amplifier 410 receives the control voltage at node 405 and the Vharvl voltage. The conduction of transistor 412 is controlled by the amplifier 410 in response to a difference between the control voltage at node 405 and the Vharvl voltage. This causes an adjustment of first cascode drive voltage Vcscl in order to control conduction of the cascode transistors 406 and 408 so as to set the bias current Ibaisl level such that the control voltage equals the Vharvl voltage. The first cascode drive voltage Vcscl is used to bias the cascode transistors for the open drain circuits 700 in each of the data channels 311, 312 and 313.

With respect to the second cascode drive voltage Vcsch, the transistor 384 carries the bias current Ibaish and the on resistance of the transistor 384 will produce a value of a control voltage at node 425. Responsive to the clock signal (CLKH) and compliment clock signal (CLKHB), the bias current Ibaish flows through an activated one of the transistors 422 and 424 along with its connected cascode transistor 426 and 428. The amplifier 430 receives the control voltage at node 425 and the Vharvh voltage. The conduction of transistor 432 is controlled by the amplifier 430 in response to a difference between the control voltage at node 425 and the Vharvh voltage. This causes an adjustment of second cascode drive voltage Vcsch in order to control conduction of the cascode transistors 426 and 428 so as to set the bias current Ibaish level such that the control voltage equals the Vharvh voltage. The second cascode drive voltage Vcsch is used to bias the cascode transistors for the open drain circuit 720 in the clock channel 310 which are controlled by signals at Vharvh level.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A power harvesting circuit for an open drain transmitter having a first open drain transmit pad and a second open drain transmit pad, comprising:
   a reference current generator circuit configured to generate a reference bias current; and
   a first cascode voltage generator circuit biased by a first bias current derived from said reference bias current, said first cascode voltage generator comprising:
      a first resistive divider comprised of a plurality of resistors coupled between the first and second open drain transmit pads;
      a first pair of cascode transistors coupled to the first and second open drain transmit pads and having control terminals coupled to a first common node of the first resistive divider;
      a first differential pair of transistors coupled in series with the first pair of cascode transistors and connected at a second common node; and
      a regulator circuit having an input coupled to the second common node and an output at the first common node.

2. The power harvesting circuit of claim 1, wherein the first differential pair of transistors have control terminals coupled to receive a first differential control signal.

3. The power harvesting circuit of claim 2, wherein the first differential control signal is a differential clock signal.

4. The power harvesting circuit of claim 3, further comprising an open drain clock transmit circuit comprising:

a second pair of cascode transistors coupled to the first and second open drain transmit pads and having control terminals coupled to the first common node; and
a second differential pair of transistors coupled in series with the second pair of cascode transistors, having a third common node coupled to a harvested power supply node and having control terminals driven by said differential clock signal.

5. The power harvesting circuit of claim 3, further comprising an open drain data transmit circuit comprising:
   a second pair of cascode transistors coupled to third and fourth open drain transmit pads and having control terminals coupled to the first common node; and
   a second differential pair of transistors coupled in series with the second pair of cascode transistors, having a third common node coupled to a harvested power supply node and having control terminals driven by a differential data signal.

6. The power harvesting circuit of claim 1, further comprising a second cascode voltage generator circuit biased by a second bias current derived from said reference bias current, said second cascode voltage generator comprising:
   a second resistive divider coupled between the first and second open drain transmit pads;
   a second pair of cascode transistors coupled to the first and second open drain transmit pads and having control terminals coupled to a third common node of the second resistive divider;
   a second differential pair of transistors coupled in series with the second pair of cascode transistors and connected at a fourth common node;
   a regulator circuit having an input coupled to the fourth common node and an output at the third common node.

7. The power harvesting circuit of claim 6,
   wherein the first differential pair of transistors have control terminals coupled to receive a first differential control signal; and
   wherein the second differential pair of transistors have control terminals coupled to receive a second differential control signal.

8. The power harvesting circuit of claim 7, wherein the first and second differential control signals are both differential clock signals having different high voltage levels.

9. The power harvesting circuit of claim 7, further comprising an open drain clock transmit circuit comprising:
   a third pair of cascode transistors coupled to the first and second open drain transmit pads and having control terminals coupled to the first common node; and
   a third differential pair of transistors coupled in series with the third pair of cascode transistors, having a fifth common node coupled to a first harvested power supply node and having control terminals driven by the first differential control signal.

10. The power harvesting circuit of claim 9, further comprising an open drain data transmit circuit comprising:
    a fourth pair of cascode transistors coupled to third and fourth open drain transmit pads and having control terminals coupled to the third common node; and
    a fourth differential pair of transistors coupled in series with the fourth pair of cascode transistors, having a sixth common node coupled to a second harvested power supply node and having control terminals driven by a differential data signal.

11. The power harvesting circuit of claim 9, further comprising:

a first harvested power regulator circuit coupled to the open drain transmit pads and configured to generate a first supply voltage at the first harvested power supply node; and a second harvested power regulator circuit coupled to the open drain transmit pads and configured to generate a second supply voltage, different from the first supply voltage, at a second harvested power supply node.

12. The power harvesting circuit of claim 11, further comprising:

a bandgap circuit configured to generate a first bandgap voltage and a second bandgap voltage;

wherein the first supply voltage is set by the first harvested power regulator circuit by a first ratio of the first and second bandgap voltages; and wherein the second supply voltage is set by the second harvested power regulator circuit by a second ratio of the first and second bandgap voltages.

13. The power harvesting circuit of claim 12, wherein the reference current generator circuit generates the reference bias current as a function of one of the first and second bandgap voltages.

14. A power harvesting circuit for an open drain transmitter having a first open drain transmit pad and a second open drain transmit pad, comprising:

a first harvested power regulator circuit coupled to the first and second open drain transmit pads and configured to generate a first power supply voltage at a first harvested power supply node;

a second harvested power regulator circuit coupled to the first and second open drain transmit pads and configured to generate a second power supply voltage, different from the first supply voltage, at a second harvested power supply node;

a first cascode voltage generator circuit biased by a first bias current and including a regulator circuit configured to generate a first cascode voltage referenced to the first power supply voltage; and a second cascode voltage generator circuit biased by a second bias current and including a regulator circuit configured to generate a second cascode voltage referenced to the second power supply voltage.

15. The power harvesting circuit of claim 14, wherein the first cascode voltage generator circuit comprises:

a first amplifier powered by the first power supply voltage; and a transistor having a control terminal coupled to an output of the first amplifier, a first conduction terminal at the first cascode voltage and a second conduction terminal at the first harvested power supply node; and wherein the second cascode voltage generator circuit comprises:

a second amplifier powered by the second power supply voltage; and a transistor having a control terminal coupled to an output of the second amplifier, a first conduction terminal at the second cascode voltage and a second conduction terminal at the second harvested power supply node.

16. The power harvesting circuit of claim 15, wherein the first cascode voltage generator circuit further comprises:

a resistive divider coupled between the first and second open drain transmit pads;

a pair of cascode transistors coupled to the first and second open drain transmit pads and having control terminals coupled to a first common node of the resistive divider at the first cascode voltage; and a differential pair of transistors coupled in series with the pair of cascode transistors and connected at a second common node providing an input to the first amplifier.

17. The power harvesting circuit of claim 16, wherein the first cascode voltage generator circuit further comprises a bias current generator coupled to the second common node.

18. The power harvesting circuit of claim 15, wherein the second cascode voltage generator circuit further comprises:

a resistive divider coupled between the first and second open drain transmit pads;

a pair of cascode transistors coupled to the first and second open drain transmit pads and having control terminals coupled to a first common node of the resistive divider at the second cascode voltage; and a differential pair of transistors coupled in series with the pair of cascode transistors and connected at a second common node providing an input to the second amplifier.

19. The power harvesting circuit of claim 18, wherein the second cascode voltage generator circuit further comprises a bias current generator coupled to the second common node.

20. The power harvesting circuit of claim 14, further comprising:

a bandgap circuit configured to generate a first bandgap voltage and a second bandgap voltage;

wherein the first power supply voltage at the first harvested power supply node is set by the first harvested power regulator circuit by a first ratio of the first and second bandgap voltages; and wherein the second power supply voltage at the second harvested power supply node is set by the second harvested power regulator circuit by a second ratio of the first and second bandgap voltages.

21. The power harvesting circuit of claim 14, further comprising a first open drain transmit circuit comprising:

a first pair of cascode transistors coupled to the first and second open drain transmit pads and having control terminals coupled to the first cascode voltage; and a first differential pair of transistors coupled in series with the first pair of cascode transistors, having a common node coupled to the first power supply voltage at the first harvested power supply node and having control terminals driven by a first differential signal.

22. The power harvesting circuit of claim 21, further comprising a second open drain transmit circuit comprising:

a second pair of cascode transistors coupled to third and fourth open drain transmit pads and having control terminals coupled to the second cascode voltage; and a second differential pair of transistors coupled in series with the second pair of cascode transistors, having a common node coupled to the second power supply voltage at the second harvested power supply node and having control terminals driven by a second differential signal.

23. The power harvesting circuit of claim 22, wherein one of the first and second differential signals is a clock signal and another of the first and second differential signals is a data signal.

* * * * *